(12) United States Patent
Masuda et al.

(10) Patent No.: US 9,570,543 B2
(45) Date of Patent: Feb. 14, 2017

(54) SEMICONDUCTOR DEVICE

(71) Applicant: Sumitomo Electric Industries, Ltd., Osaka-shi (JP)

(72) Inventors: Takeyoshi Masuda, Osaka (JP); Shunsuke Yamada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/786,087

(22) PCT Filed: Apr. 14, 2014

(86) PCT No.: PCT/JP2014/060583
§ 371 (c)(1),
(2) Date: Oct. 21, 2015

(87) PCT Pub. No.: WO2014/192444
PCT Pub. Date: Dec. 4, 2014

(65) Prior Publication Data
US 2016/0071924 A1 Mar. 10, 2016

(30) Foreign Application Priority Data

May 29, 2013 (JP) ................. 2013-113009

(51) Int. Cl.
*H01L 29/00* (2006.01)
*H01L 29/06* (2006.01)
(Continued)

(52) U.S. Cl.
CPC ......... *H01L 29/0619* (2013.01); *H01L 21/045* (2013.01); *H01L 21/049* (2013.01);
(Continued)

(58) Field of Classification Search
CPC ............. H01L 29/0619; H01L 29/0649; H01L 29/872; H01L 29/4236; H01L 29/7827; H01L 29/7813; H01L 29/2003; H01L 29/7811; H01L 29/1608; H01L 21/045; H01L 21/049; H01L 21/0445
See application file for complete search history.

(56) References Cited

U.S. PATENT DOCUMENTS 8,471,267 B2 * 6/2013 Hayashi ............... H01L 21/045
257/77
2010/0140689 A1 6/2010 Yedinak et al.
2011/0220917 A1 9/2011 Hayashi et al.

FOREIGN PATENT DOCUMENTS

JP 11-330496 A 11/1999
JP 2009-081385 A 4/2009
(Continued)

OTHER PUBLICATIONS

International Search Report in PCT International Application No. PCT/JP2014/060583, dated Jul. 1, 2014.

*Primary Examiner* — Nikolay Yushin
(74) *Attorney, Agent, or Firm* — Venable LLP; Michael A. Sartori; F. Brock Riggs

(57) ABSTRACT

A semiconductor substrate has an element portion and a termination portion located on an outer side of the element portion. A first electrode layer is provided on a first surface of the semiconductor substrate. A second electrode layer is provided on a second surface of the semiconductor substrate in an upper portion of the element portion. An interlayer insulation film is provided on the second surface of the semiconductor substrate. The interlayer insulation film has: an element insulation portion that provides insulation between a part of the element portion of the semiconductor substrate and the second electrode layer; and a termination insulation portion covering a termination portion of the semiconductor substrate. The termination insulation portion (Continued)

includes a high dielectric constant film that is higher in dielectric constant than the element insulation portion.

10 Claims, 12 Drawing Sheets

(51) Int. Cl.
*H01L 29/872* (2006.01)
*H01L 29/16* (2006.01)
*H01L 29/20* (2006.01)
*H01L 21/04* (2006.01)
*H01L 29/423* (2006.01)
*H01L 29/78* (2006.01)

(52) U.S. Cl.
CPC ...... *H01L 29/0649* (2013.01); *H01L 29/1608* (2013.01); *H01L 29/2003* (2013.01); *H01L 29/4236* (2013.01); *H01L 29/7811* (2013.01); *H01L 29/7813* (2013.01); *H01L 29/7827* (2013.01); *H01L 29/872* (2013.01)

(56) References Cited

FOREIGN PATENT DOCUMENTS

| JP | 4796665 | 3/2011 |
|----|---------|--------|
| JP | 2012-004312 A | 1/2012 |

* cited by examiner

SEMICONDUCTOR DEVICE

TECHNICAL FIELD

The present invention relates to a semiconductor device, and particularly to a semiconductor device having a semiconductor substrate made of a wide band gap semiconductor layer.

BACKGROUND ART

As compared with silicon semiconductors currently most widely used, a semiconductor layer itself that is made of a wide band gap semiconductor can withstand a significantly Mai electric field. Meanwhile, application of a relatively high electric field is more likely to cause, irrespective of the type of the semiconductor material, creeping discharge resulting from electric field concentration at the termination portion surrounding element portion on a semiconductor substrate. Therefore, countermeasures against creeping discharge are particularly required when a wide band gap semiconductor is used. Creeping discharge can be suppressed by increasing a dielectric constant of an interlayer insulation film. For example, Japanese Patent No. 4796665 (PTD 1) discloses that the relative dielectric constant of the interlayer insulation film is set at 20 or more.

CITATION LIST

Patent Document

PTD 1: Japanese Patent No. 4796665

SUMMARY OF INVENTION

Technical Problem

If the dielectric constant of the interlayer insulation film is simply increased, occurrence of creeping discharge can be suppressed, but the volume of the wiring in a wiring layer on the interlayer insulation film is increased. For example, in the case where the semiconductor device is a MOSFET (Metal Oxide Semiconductor Field Effect Transistor), the capacitance between the wiring layer of the source and the gate electrode is increased, thereby deteriorating switching characteristics.

The present invention has been made to solve the above-described problems. An object of the present invention is to prevent occurrence of creeping discharge while avoiding an increase in volume of the wiring.

Solution to Problem

A semiconductor device includes: a semiconductor substrate; a first electrode layer; a second electrode layer; and an interlayer insulation film. The semiconductor substrate is made of a wide band gap semiconductor, and has a first surface and a second surface opposite to the first surface. The semiconductor substrate has an element portion and a termination portion located on an outer side of the element portion. The first electrode layer is provided on the first surface of the semiconductor substrate. The second electrode layer is provided on the second surface of the semiconductor substrate in an upper portion of the element portion. The interlayer insulation film is provided on the second surface of the semiconductor substrate. The interlayer insulation film has: an element insulation portion providing insulation between a part of the element portion of the semiconductor substrate and the second electrode layer; and a termination insulation portion covering the termination portion of the semiconductor substrate. The termination insulation portion includes a high dielectric constant film that is higher in dielectric constant than the element insulation portion.

Advantageous Effects of Invention

According to the present invention, the high dielectric constant film is provided not in the element insulation portion but in the termination insulation portion of the interlayer insulation film. Consequently, occurrence of creeping discharge on the termination insulation portion can be prevented while avoiding an increase in volume of the wiring in the second electrode layer on the element insulation portion.

DESCRIPTION OF EMBODIMENTS

Figure 1:
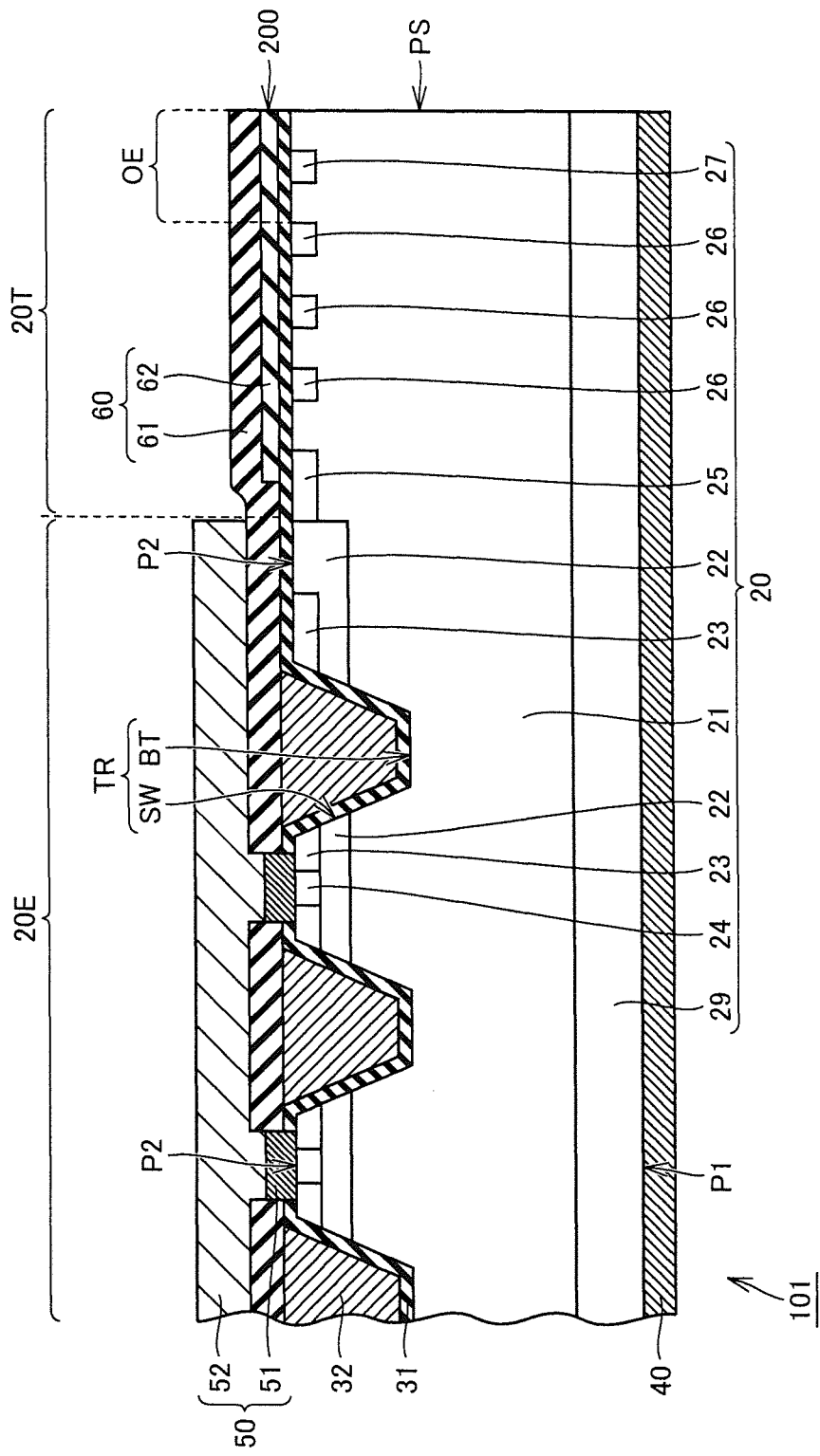
FIG. 1 is a partial cross-sectional view schematically showing the configuration of a semiconductor device in the first embodiment of the present invention.

The embodiments of the present invention will be hereinafter described with reference to the accompanying drawings.

First, an outline will be described in the following (i) to (x).

(i) A semiconductor device 101, 102, 103 includes: a semiconductor substrate 20, 20d, 20p; a first electrode layer 40, 70; a second electrode layer 50, 80; and an interlayer insulation film 60, 60a, 60b, 60c. Semiconductor substrate 20, 20d, 20p is made of a wide band gap semiconductor, and has a first surface P1 and a second surface P2 opposite to first surface P1. Semiconductor substrate 20, 20d, 20p has an element portion 20E and a termination portion 20T located on the outer side of element portion 20E. First electrode layer 40, 70 is provided on first surface P1 of semiconductor substrate 20, 20d, 20p. Second electrode layer 50, 80 is provided on second surface P2 of semiconductor substrate 20, 20d, 20p in an upper portion of element portion 20E. Interlayer insulation film 60, 60a, 60b, 60c is provided on second surface P2 of semiconductor substrate 20, 20d, 20p. Interlayer insulation film 60, 60a, 60b, 60c includes: an element insulation portion providing insulation between a part of element portion 20E of semiconductor substrate 20, 20d, 20p and second electrode layer 50, 80; and a termination insulation portion covering termination portion 20T of semiconductor substrate 20, 20d, 20p. The termination insulation portion includes a high dielectric constant film 62, 62S that is higher in dielectric constant than the element insulation portion.

According to the present semiconductor device, high dielectric constant film 62, 62S is provided not in the element insulation portion but in the termination insulation portion of interlayer insulation film 60, 60a, 60b, 60c. Accordingly, occurrence of creeping discharge on the termination insulation portion can be prevented while avoiding an increase in volume of the wiring in second electrode layer 50, 80 on the element insulation portion (ii) In the above-described (i), interlayer insulation film 60, 60a, 60b, 60c may include a low dielectric constant film 61 having the dielectric constant of the element insulation portion and included in each of the element insulation portion and the termination insulation portion.

Thereby, the element insulation portion and a portion of the termination insulation portion that has a relatively low dielectric constant may be collectively formed by low dielectric constant film 61.

(iii) In the above-described (ii), high dielectric constant film 62, 62S may be located between low dielectric constant film 61 and second surface P2 of semiconductor substrate 20, 20d, 20p.

Thereby, high dielectric constant film 62, 62S can be located near semiconductor substrate 20, 20d, 20p.

(iv) In the above-described (i) to (iii), second surface P2 of semiconductor substrate 20, 20d, 20p may include: an outer edge portion OE having the first conductivity type and located at an outer edge of second surface P2; and a guard ring portion 26 having the second conductivity type different from the first conductivity type and located on the inner side of outer edge portion OE.

Thereby, electric field concentration on the termination insulation portion is reduced by the guard ring portion. Therefore, occurrence of creeping discharge on the termination insulation portion is more reliably prevented.

(v) In the above-described (iv), high dielectric constant film 62, 62S may be located on second surface P2 of semiconductor substrate 20, 20d, 20p so as to extend over guard ring portion 26 and outer edge portion OE.

Thereby, it becomes possible to suppress the electric field concentration that is more likely to occur in the vicinity of the boundary between guard ring portion 26 and outer edge portion OE, that is, at the outermost edge of guard ring portion 26. Therefore, occurrence of creeping discharge on the termination insulation portion is more reliably prevented.

(vi) In the above-described (i) to (v), semiconductor substrate 20, 20d, 20p may have a substrate side surface PS that connects first surface P1 and second surface P2. High dielectric constant film 62 extends to a surface that is located in line with substrate side surface PS.

This allows high dielectric constant film 62 to extend toward the outside to the maximum extent on second surface P2 of semiconductor substrate 20, 20d, 20p. Thereby, occurrence of creeping discharge on the termination insulation portion is more reliably prevented.

(vii) In the above-described (i) to (vi), the wide band gap semiconductor may be one of silicon carbide and gallium nitride.

In this case, electric breakdown is less likely to occur in the semiconductor itself. Thus, a breakdown resulting from creeping discharge of the semiconductor device may be more problematic. According to the present semiconductor device, creeping discharge can be effectively suppressed as described above.

(viii) In the above-described (i) to (Vii), semiconductor device 101, 102, 103 may be configured such that a voltage of 600V or more can be applied between the first electrode and the second electrode.

In this way, when a relatively high voltage is applied to semiconductor device 101, 102, 103, creeping discharge is more likely to occur. According to the present semiconductor device, creeping discharge can be effectively suppressed as described above.

(ix) In the above-described (i) to (viii), semiconductor device 101, 102 may include a transistor that provides switching between first electrode layer 40 and second electrode layer 50.

Accordingly, in semiconductor device 101, 102 having a transistor, occurrence of creeping discharge on the termination insulation portion can be prevented while avoiding an increase in volume of the wiring in second electrode layer 50 on the element insulation portion.

(x) In the above-described (i) to (ix), semiconductor device 103 may include a diode that provides rectification between first electrode layer 70 and second electrode layer 80.

Consequently, in semiconductor device 103 having a diode, occurrence of creeping discharge on the termination insulation portion can be prevented while avoiding an increase in volume of the wiring in second electrode layer 80 on the termination insulation portion.

Then, further specific details will be described in the following first to six embodiments. In the accompanying drawing, the same or corresponding components are designated by the same reference characters, and description thereof will not be repeated.

(First Embodiment)

As shown in FIG. 1, a MOSFET 101 (semiconductor device) is a trench gate type transistor. MOSFET 101 has an epitaxial substrate 20 (a semiconductor substrate, a gate oxide film 31 (a gate insulating film), a gate electrode 32, a drain electrode layer 40 (the first electrode layer), a source electrode layer 50 (the second electrode layer), and an interlayer insulation film 60. MOSFET 101 is a power semiconductor device providing switching between drain electrode layer 40 and source electrode layer 50. Specifically, MOSFET 101 is configured to be capable of applying preferably a voltage of 600V or more, more preferably 1200V or more, and further more preferably 3300V or more, between drain electrode layer 40 and source electrode layer 50.

Epitaxial substrate 20 is made of a wide band gap semiconductor. The wide band gap semiconductor is made preferably of silicon carbide, gallium nitride or a diamond, and more preferably of silicon carbide or gallium nitride. It is preferable that silicon carbide has a hexagonal crystal structure. Epitaxial substrate 20 has a lower surface P1 (the first surface), an upper surface P2 (the second surface opposite to the first surface), and a substrate side surface PS connecting lower surface P1 and upper surface P2. Epitaxial substrate 20 has an element portion 20E (a portion on the left side of a dashed line in FIG. 1) and a termination portion 20T located on the outer side of element, portion 20E (a portion on the right side of the dashed line in FIG. 1).

Epitaxial substrate 20 includes a single-crystal substrate 29, a drift layer 21 having n type conductivity, a body region 22 having p type conductivity, a source region 23 having n type conductivity, and a contact region 24 having p type conductivity. Single-crystal substrate 29 has one surface forming lower surface P1. Drift layer 21 is provided on the surface of single-crystal substrate 29 that is opposite to lower surface P1. Body region 22 is in contact with drill layer 21. Body region 22 is separated from lower surface P1 by drift layer 21. The impurity concentration of body region 22 is preferably approximately $5 \times 10^{17}/cm^3$ or more and approximately $3 \times 10^{18}/cm^3$ or less, and for example, approximately $1 \times 10^{18}/cm^3$. Source region 23 is in contact with body region 22. Source region 23 partially forms upper surface P2. Contact region 24 is in contact with body region 22. Contact region 24 partially forms upper surface P2. Contact region 24 is higher in impurity concentration than body region 22.

A JTE (Junction Termination Extension) region 25, a guard ring portion 26 and a field stop portion 27 are provided on upper surface P2 of epitaxial substrate 20 in the upper portion of termination portion 20T. JTE region 25 has p type conductivity and is connected to body region 22. Guard ring portion 26 has p type conductivity and is separated from body region 22. Field stop portion 27 has n type conductivity and is higher in impurity concentration than drift layer 21. Field stop portion 27 is located on upper surface P2 of epitaxial substrate 20 on the outer side of guard ring portion 26. Accordingly, upper surface P2 of epitaxial substrate 20 is configured so as to include: outer edge portion OE having n type conductivity and located at the outer edge of upper surface P2; and guard ring portion 26 having p type conductivity and located on the inner side of outer edge portion OE.

Drain electrode layer 40 is provided on lower surface P1 of epitaxial substrate 20. Drain electrode layer 40 is in ohmic connection to lower surface P1 of epitaxial substrate 20.

Source electrode layer 50 is provided on upper surface P2 of epitaxial substrate 20 in the upper portion of element portion 20E. Source electrode layer 50 has an ohmic portion 51 and a wiring portion 52. Ohmic portion 51 is in ohmic connection to upper surface P2 of epitaxial substrate 20. Specifically, ohmic portion 51 is in ohmic connection to source region 23 and contact region 24.

A trench TR is provided in upper surface P2 of epitaxial substrate 20. Trench TR has a sidewall surface SW and a bottom surface BT. Sidewall surface SW penetrates through source region 23 and body region 22 to drift layer 21. Thereby, body region 22 forms a portion corresponding to sidewall surface SW in upper surface P2. Sidewall surface SW includes a channel surface of MOSFET 101 on body region 22.

Gate oxide film 31 covers sidewall surface SW and bottom surface BT of trench TR. Accordingly, gate oxide film 31 covers body region 22 on sidewall surface SW. Gate electrode 32 is provided on gate oxide film 31.

Interlayer insulation film 60 is provided on upper surface P2 of epitaxial substrate 20 and covers gate electrode 32. Gate oxide film 31 and interlayer insulation film 60 each have an opening through which each of source region 23 and contact region 24 is exposed on upper surface P2. In this opening, ohmic portion 51 of source electrode layer 50 is in ohmic contact with each of source region 23 and contact region 24.

Interlayer insulation film 60 includes: an element insulation portion (a portion on the left side of the dashed line in FIG. 1) that provides insulation between a part of element portion 20E of epitaxial substrate 20 and source electrode layer 50; and a termination insulation portion (a portion on the right side of the dashed line in FIG. 1) covering termination portion 20T of epitaxial substrate 20. Interlayer insulation film 60 has low dielectric constant film 61 and high dielectric constant film 62.

Low dielectric constant film 61 is located to extend beyond the dashed line in FIG. 1. Accordingly, low dielectric constant film 61 is included in each of the element insulation portion and the termination insulation portion. In the present embodiment, low dielectric constant film 61 forms the entire element insulation portion. Accordingly, the element insulation portion has the same dielectric constant as that of low dielectric constant film 61. Low dielectric constant film 61 is for example a silicon oxide film, in which case the relative dielectric constant of low dielectric constant film 61 is approximately 3.9.

High dielectric constant film 62 is higher in dielectric constant than the element insulation portion. High dielectric constant film 62 is included only in a region on then right side in FIG. 1, and accordingly, included only in the termination insulation portion. High dielectric constant film 62 is located between upper surface P2 of epitaxial substrate 20 and low dielectric constant film 61. High dielectric constant film 62 is located on upper surface P2 of epitaxial substrate 20 so as to extend over guard ring portion 26 and outer edge portion OE. In the present embodiment, high dielectric constant film 62 has a side surface 200 that is located in line with substrate side surface PS. In other words, high dielectric constant film 62 extends to the surface that is located in line with substrate side surface PS.

Assuming that the voltage to be applied to high dielectric constant film 62 is defined as $V_h$, the relative dielectric constant of high dielectric constant film 62 is defined as $\epsilon$ and the thickness of high dielectric constant film 62 is defined as d, the electric field applied to high dielectric constant film 62 is $V_h/(\epsilon \cdot d)$. it is preferable that this electric field is set at 0.5 MV/cm or less. Thus, on the condition that $V_h=600(V)$, the lower limit of the thickness of high dielectric constant film 62 is $12/\epsilon$ (μm). The lower limit of this thickness is for example; 0.15 μm in the case of a $TiO_2$ film having a relative dielectric constant of 80; 1.3 μm in the case of $Al_2O_3$ having a relative dielectric constant of 8.5 to 10; 0.5 μm in the case of $HfO_2$ having a relative dielectric constant of 24; 0.8 μm in the case of $ZrO_2$ having a relative dielectric constant of 11 to 18; 0.48 μm in the case of $Ta_2O_5$ having a relative dielectric constant of 25; 0.48 μm in the case of $La_2O_3$ having a relative dielectric constant of 25; and 1.7 μm in the case of $Si_3N_4$ having a relative dielectric constant of 7. In this way, the higher the dielectric constant is, the thinner the high dielectric constant film 62 can be formed. For example, the thickness of high dielectric constant film 62 can be reduced below 2 μm.

Figure 2:
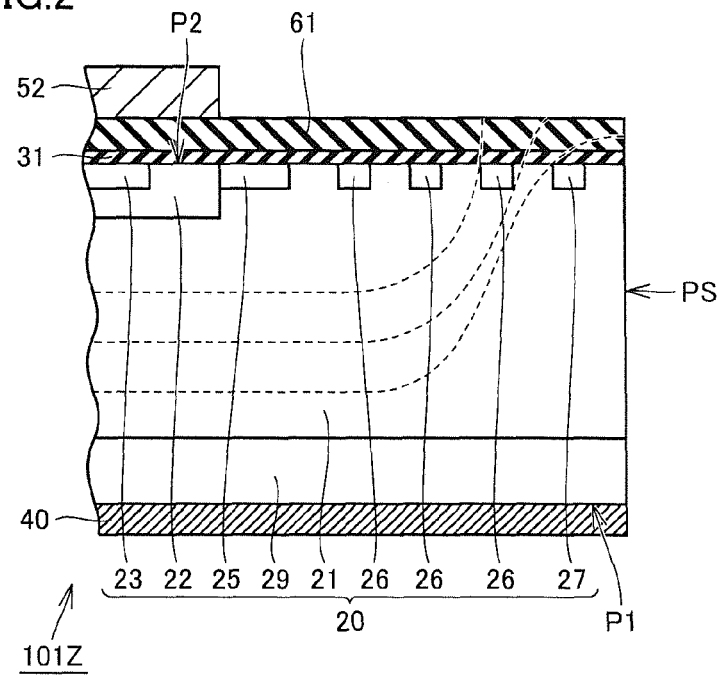
FIG. 2 is a partial cross-sectional view showing an example of equipotential lines in a semiconductor device of Comparative Example.

Then, a MOSFET 101Z of Comparative Example (FIG. 3) will be hereinafter described. The interlayer insulation film of MOSFET 101Z does not have high dielectric constant film 62 (FIG. 1) but only has low dielectric constant film 61. In this case, as indicated by dashed lines in FIG. 2, the ends of equipotential lines tend to be located in the vicinity of the end of the upper surface of low dielectric constant film 61 (the upper surface in FIG. 2) as an interlayer insulation film. Consequently, creeping discharge becomes more likely to occur on the upper surface of low dielectric constant film 61.

Figure 3:
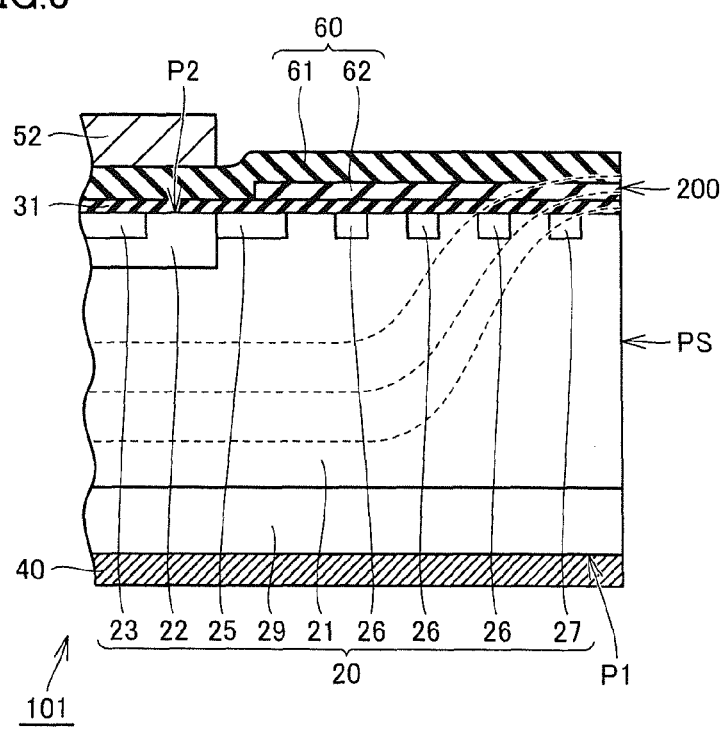
FIG. 3 is a partial cross-sectional view showing an example of equipotential lines in the semiconductor device in FIG. 1.

In contrast, according to the present embodiment, by providing high dielectric constant film 62, the ends of equipotential lines are guided to the vicinity of side surface 200 of high dielectric constant film 62 (the right-side surface in FIG. 3) as indicated by dashed lines in FIG. 3. Consequently, creeping discharge is less likely to occur on the upper surface of interlayer insulation film 60. Furthermore, high dielectric constant film 62 is provided in interlayer insulation film 60 so as to be located not in the element insulation portion (a portion on the left side of the dashed line in FIG. 1) but in the termination insulation portion (a portion on the right side of the dashed line in FIG. 1). Accordingly, the volume of the wiring in source electrode layer 50 on the element insulation portion can be prevented from increasing. In this way, according to the present embodiment, occurrence of creeping discharge can be prevented while avoiding an increase in volume of the wiring in source electrode layer 50.

Furthermore, a portion of the termination insulation portion that has a relatively low dielectric constant and the element insulation portion may be collectively formed by low dielectric constant film 61.

Furthermore, high dielectric constant film 62 is located between upper surface P2 of epitaxial substrate 20 and low dielectric constant film 61. Accordingly, high dielectric constant film 62 can be arranged near epitaxial substrate 20.

Furthermore, electric field concentration on the termination insulation portion is reduced by guard ring portion 26. Accordingly, occurrence of creeping discharge on the termination insulation portion is more reliably prevented.

Furthermore, high dielectric constant film 62 is located on upper surface P2 of epitaxial substrate 20 so as to extend over guard ring portion 26 and outer edge portion OE. Thereby, it becomes possible to suppress electric field concentration that is more likely to occur in the vicinity of the boundary between guard ring portion 26 and outer edge portion OE, that is, in the vicinity of the outermost edge of guard ring portion 26. Therefore, occurrence of creeping discharge on the termination insulation portion is more reliably prevented.

Furthermore, high dielectric constant film 62 extends to the surface that is located in line with substrate side surface PS. This allows high dielectric constant film 62 to extend toward the outside to the maximum extent on upper surface P2 of epitaxial substrate 20. Therefore, occurrence of creeping discharge on the termination insulation portion is more reliably prevented.

It is preferable that the wide band gap semiconductor used as a material of epitaxial substrate 20 is one of silicon carbide and gallium nitride. In this case, even if a relatively higher voltage is applied, electric breakdown is less likely to occur in the semiconductor itself. Thus, breakdown caused by creeping discharge may be more problematic. According to MOSFET 101, this creeping discharge can be effectively suppressed.

It is preferable that MOSFET 101 is configured such that a voltage of 600V or more can be applied between drain electrode layer 40 and source electrode layer 50. In the case where a relatively high voltage is applied in this way, creeping discharge may be further problematic. According to MOSFET 101, this creeping discharge can be effectively suppressed.

Then, a method of manufacturing MOSFET 101 will be hereinafter described.

Figure 4:
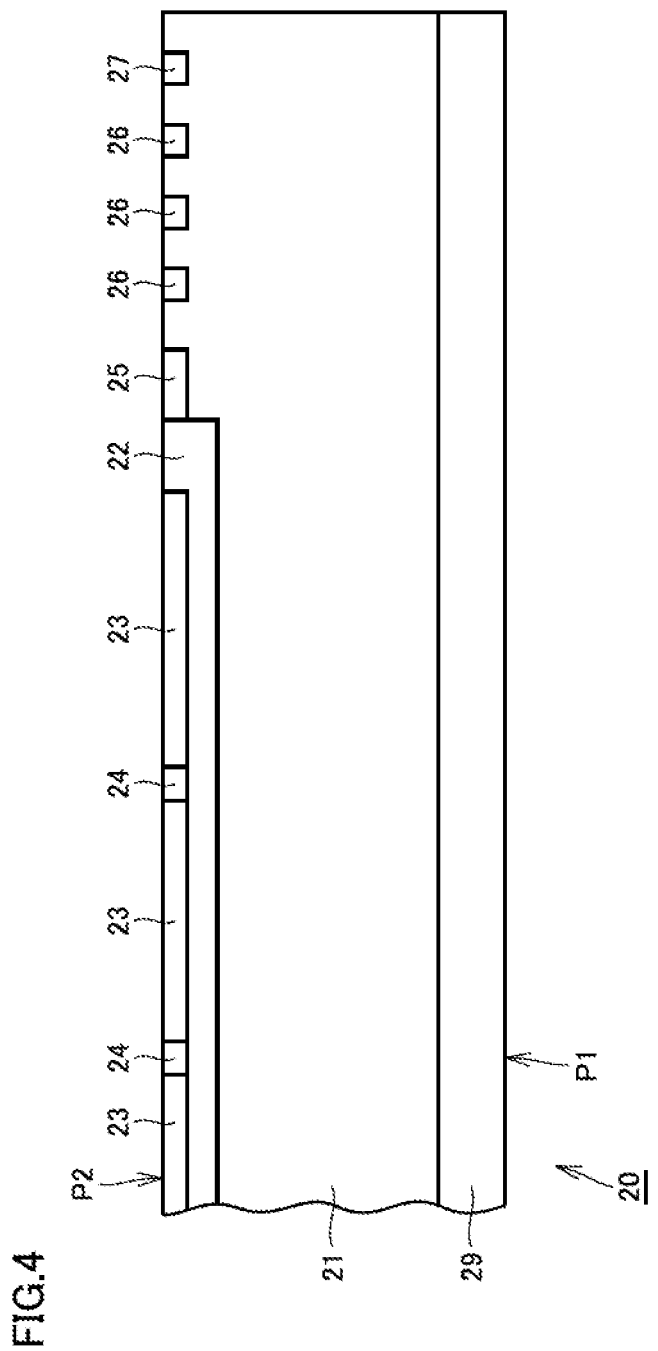
FIG. 4. is a partial cross-sectional view schematically showing the first step of a method of manufacturing the semiconductor device in FIG. 1.

Referring to FIG. 4, single-crystal substrate 29 having lower surface P1 is prepared. Then, drift layer 21 is formed by epitaxial growth on the surface opposite to lower surface P1. This epitaxial growth is carried out by the CVD (Chemical Vapor Deposition) method. In this case, hydrogen gas may be used as carrier gas. Examples of raw material gas may be mixed gas of silane ($SiH_4$) and propane ($C_3H_8$), for example. In this case, it is preferable that nitrogen (N) or phosphorus (P) is introduced as impurities, for example.

Then, body region 22, source region 23, contact region 24, JTE region 25, guard ring portion 26, and field stop portion 27 are formed on drift layer 21, which may be implemented by ion implantation. Then, activation annealing treatment for activating impurities introduced by ion implantation is carried out. For example, heating is carried out for 30 minutes at a temperature of about 1700° C. in the atmosphere of argon Ar) gas.

Figure 5:
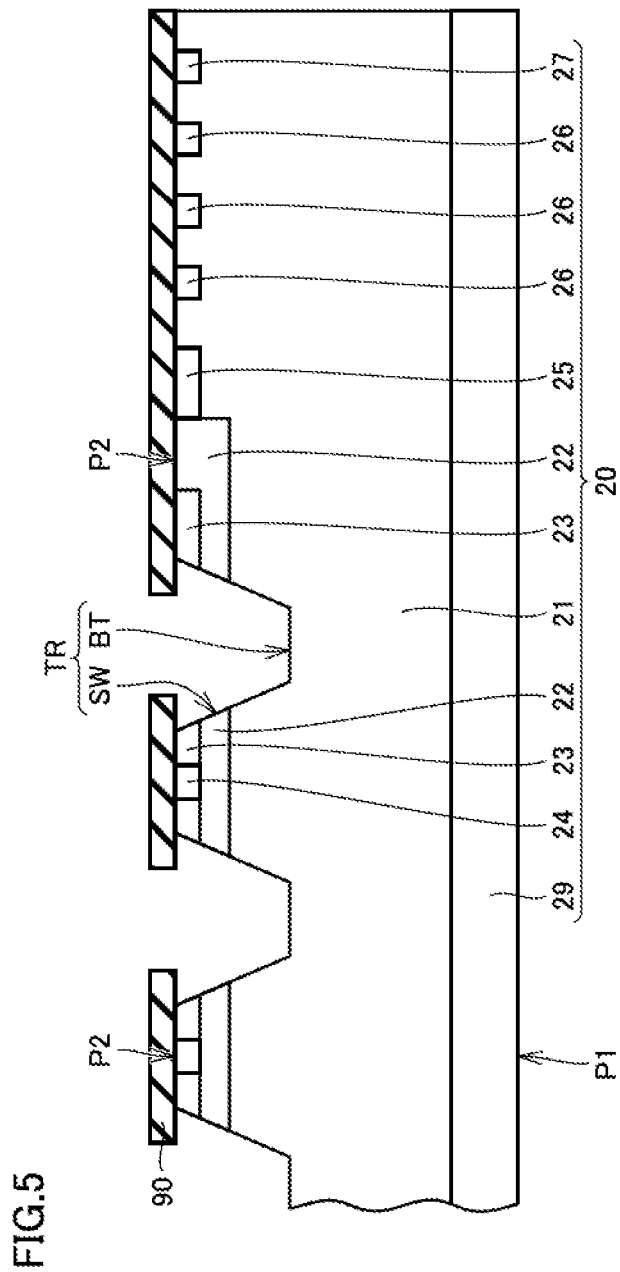
FIG. 5 is a partial cross-sectional view schematically showing the second step of the method of manufacturing the semiconductor device in FIG. 1.

As shown in FIG. 5, a mask layer 90 having an opening is formed by the photolithography method on the surface formed of source region 23 and contact region 24. Mask layer 90 can be made, for example, using a silicon oxide film or the like. The opening is provided at a position corresponding to the position of trench TR (FIG. 1).

Then, trench TR is formed in epitaxial substrate 20 by etching using mask layer 90, in which case heat etching is preferable. Heat etching may be carried out by heating in the atmosphere containing reactive gas having at least one or more types of halogen atoms, for example. At least one or more types of halogen atoms contain at least one of a chlorine (Cl) atom and a fluorine (F) atom. This atmosphere is $Cl_2$, $BCL_3$, $SF_6$, or $CSF_4$, for example. For example, heat etching is carried out using mixed gas of chlorine gas and oxygen gas as reaction gas, for example, at a heat treatment temperature of about 700° C. or higher and about 1000° C. or lower. It is to be noted that the reaction gas may contain carrier gas in addition to chlorine gas and oxygen gas as described above. Examples of carrier gas can be nitrogen ($N_2$) gas, argon gas, helium gas, and the like. Also, in the case where the heat treatment temperature is set at about 700° C. or higher and about 1000° C. or lower as described above, the etching rate for SiC is approximately 70 μm/hour, for example. Furthermore, in this case, since mask layer 90 made of silicon oxide has an extremely high selective ratio to SiC, this mask layer 90 is not substantially etched during etching of SiC. After formation of trench TR, mask layer 90 is removed by any method such as etching.

Figure 6:
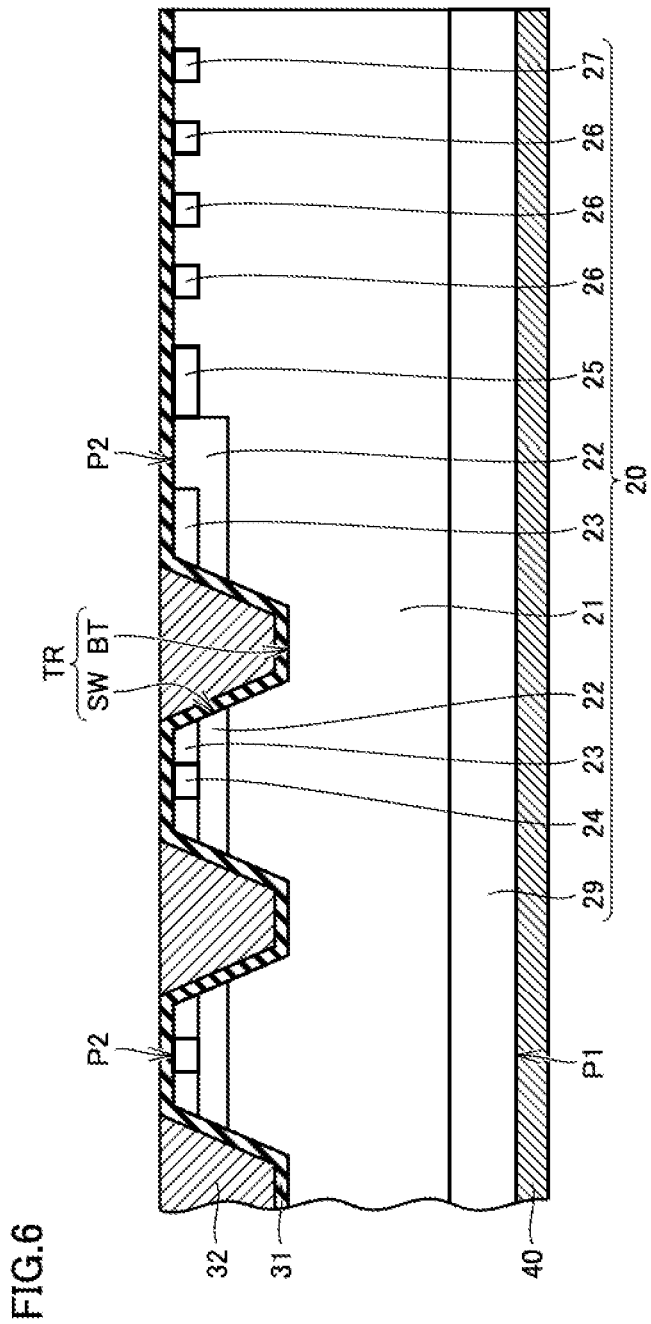
FIG. 6 is a partial cross-sectional view schematically showing the third step of the method of manufacturing the semiconductor device in FIG. 1.

Referring to FIG. 6, gate oxide film 31 covering each of sidewall surface SW and bottom surface BT of trench TR is formed. Gate oxide film 31 may be formed by thermal oxidation of epitaxial substrate 20, for example.

Formation of gate oxide film 31 may be followed by NO annealing carried out using nitric oxide (NO) gas as atmospheric gas. The temperature profile has conditions such as a temperature of about 1100° C. or higher and about 1300° C. or lower, and the holding time of about one hour, for example. Thereby, nitrogen atoms are introduced into the interface region between gate oxide film 31 and body region 22. As a result, formation of the interface state in the interface region is suppressed, so that channel mobility can be improved. If such introduction of nitrogen atoms can be implemented, gas other than NO gas may be used as atmospheric gas.

This NO annealing may be further followed by Ar annealing carried out using argon (Ar) as atmospheric gas. It is preferable that the heating temperature for NO annealing is higher than the heating temperature in the above-described NO annealing and lower than the melting point of gate oxide film 31. The time period during which this heating temperature is maintained is about 1 hour, for example. Thereby, formation of the interface state in the interface region between gate oxide film 31 and body region 22 is further suppressed. As atmospheric gas, other inert gas such as nitrogen gas may be used in place of Ar gas.

Then, gate electrode 32 is formed on gate oxide film 31. Specifically, gate electrode 32 is formed on gate oxide film 31 so as to fill the region within trench TR while having gate oxide film 31 interposed therebetween. The method of forming gate electrode 32 may be carried out by film formation of a conductor or doped polycrystalline silicon and by CMP (Chemical Mechanical Polishing), for example.

Figure 7:
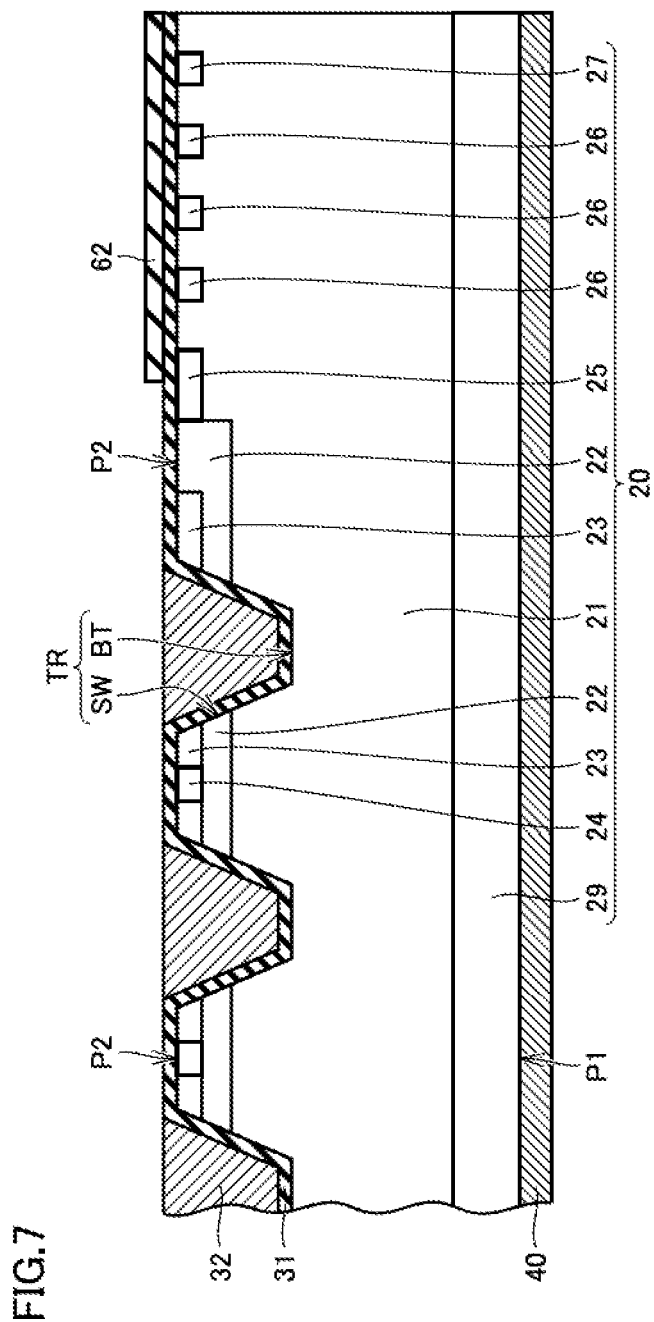
FIG. 7 is a partial cross-sectional view schematically showing the fourth step of the method of manufacturing the semiconductor device in FIG. 1.
Figure 8:
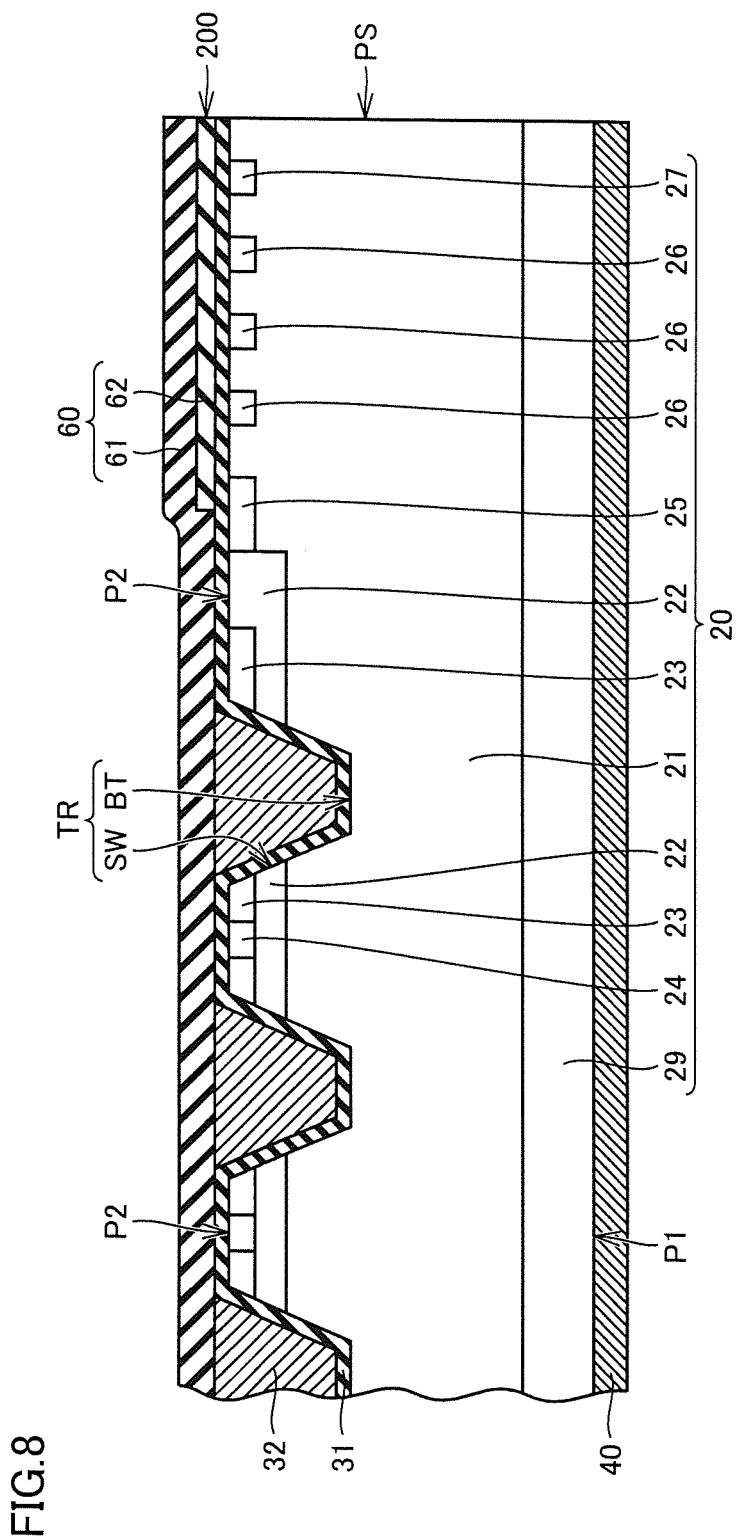
FIG. 8 is a partial cross-sectional view schematically showing the fifth step of the method of manufacturing the semiconductor device in FIG. 1.

As shown in FIG. 7, high dielectric constant film 62 forming a part of interlayer insulation film 60 (FIG. 1) is formed. As shown in FIG. 8, low dielectric constant film 61 of interlayer insulation film 60 (FIG. 1) is formed. Thereby, interlayer insulation film 60 covering gate oxide film 31 and gate electrode 32 is formed.

Figure 9:
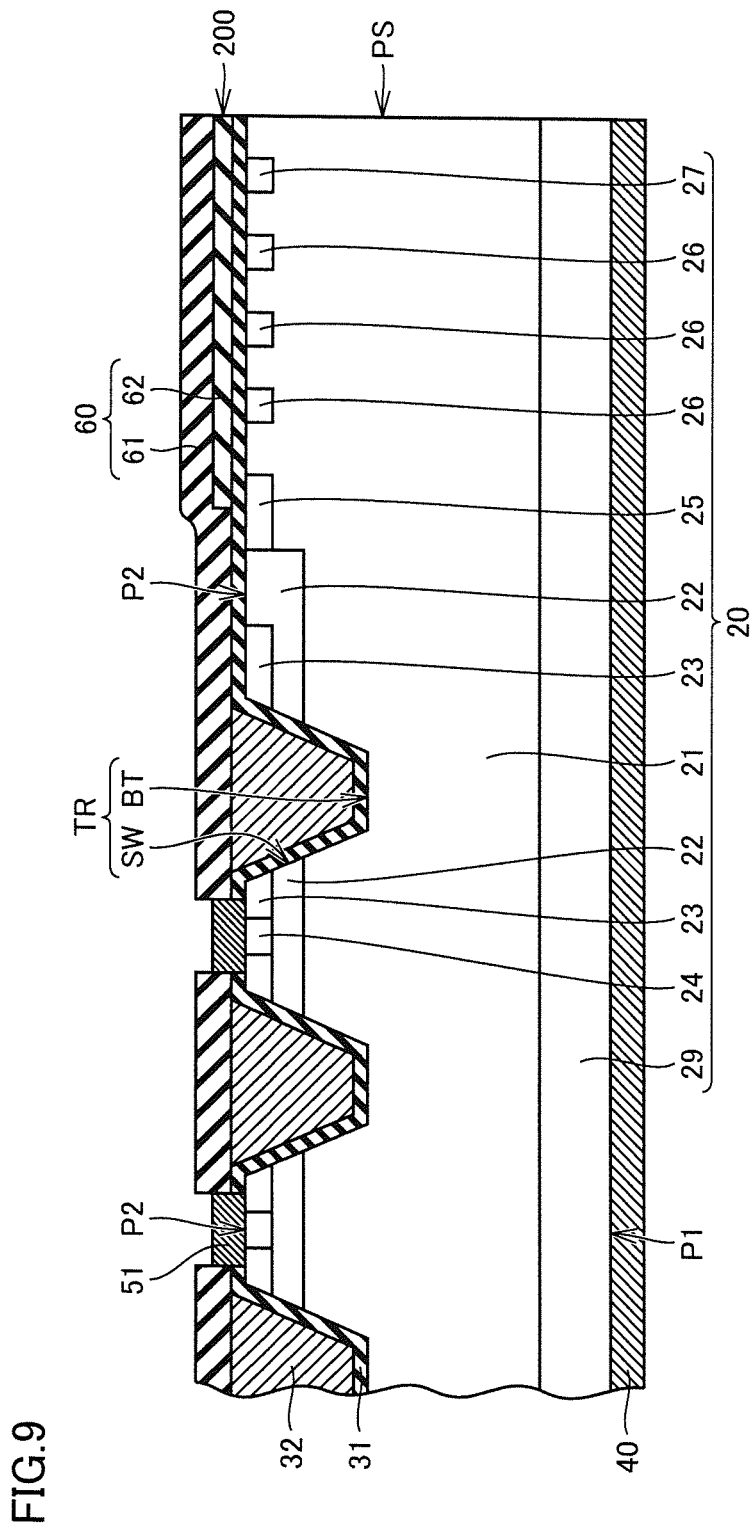
FIG. 9 is a partial cross-sectional view schematically showing the sixth step of the method of manufacturing the semiconductor device in FIG. 1.

Referring to FIG. 9, etching is carried out so as to provide an opening in each of low dielectric constant film 61 of interlayer insulation film 60 and gate oxide film 31. Each of source region 23 and contact region 24 is exposed through this opening on upper surface P2. Then, ohmic portion 51 of source electrode layer 50 (FIG. 1) is formed that is in contact with each of source region 23 and contact region 24 on upper surface P2. Furthermore, drain electrode layer 40 is formed on lower surface P1 of epitaxial substrate 20.

Again referring to FIG. 1, wiring portion 52 of source electrode layer 50 is formed. Thereby, MOSFET 101 is obtained.

Figure 10:
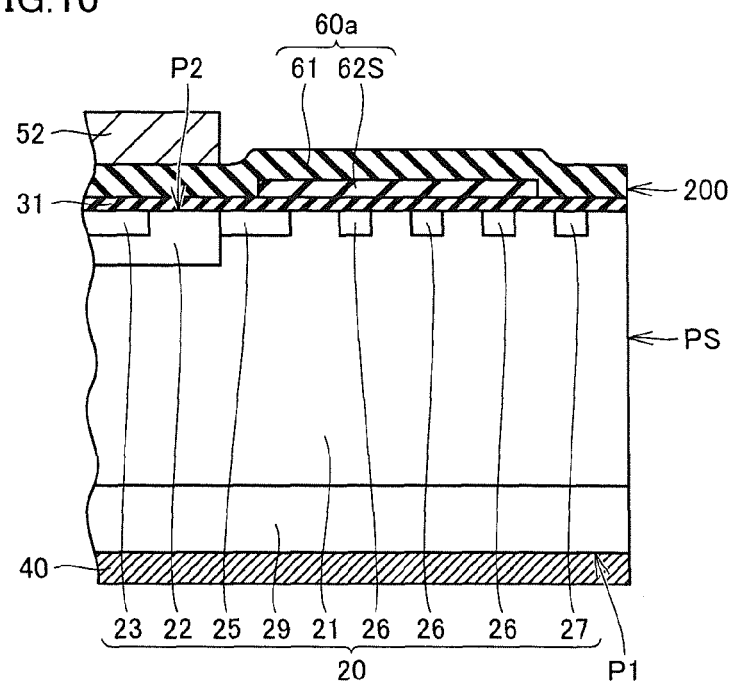
FIG. 10 is a partial cross-sectional view showing the first modification of FIG. 1.
Figure 11:
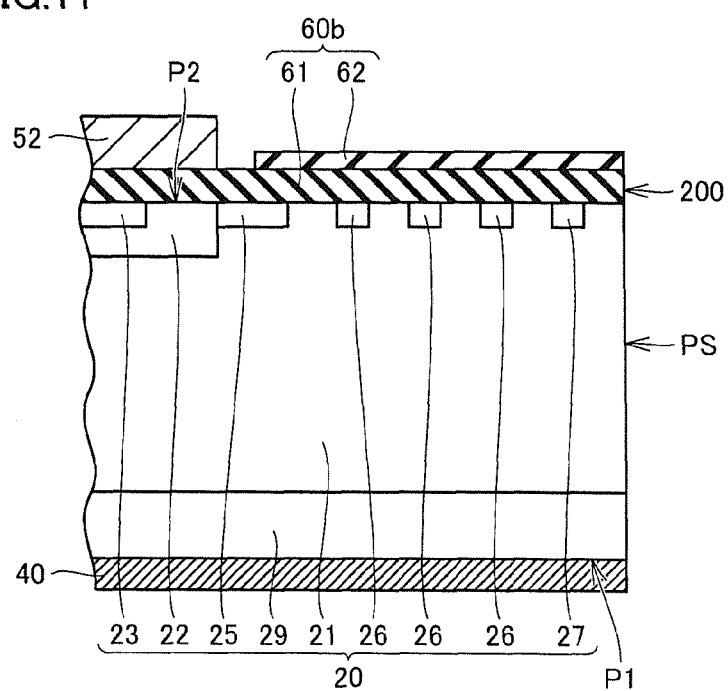
FIG. 11 is a partial cross-sectional view showing the second modification of FIG. 1.
Figure 12:
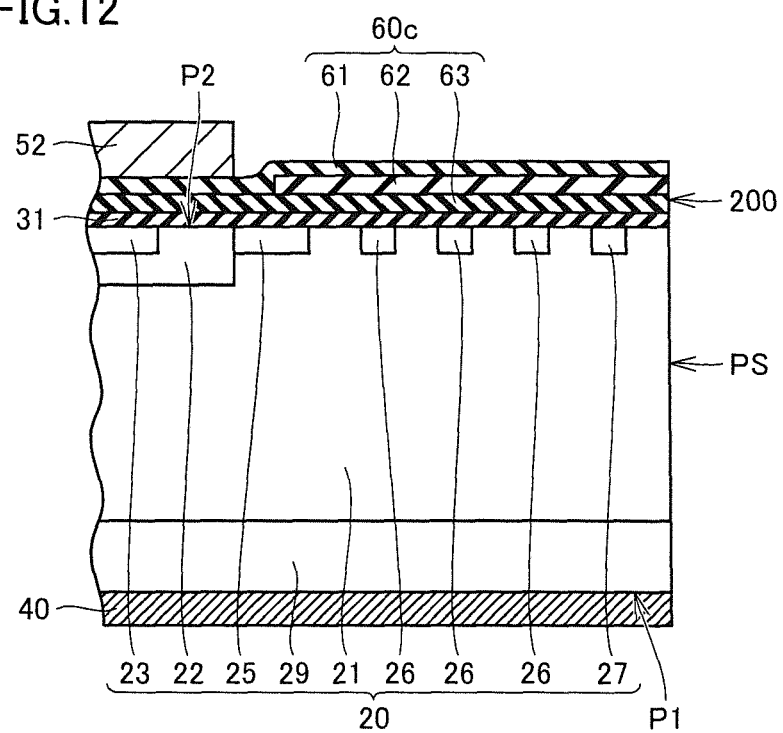
FIG. 12 is a partial cross-sectional view showing the third modification of FIG. 1.

Then, interlayer insulation films 60a to 60c (FIGS. 10 to 12) that each are a modification of interlayer insulation film 60 in MOSFET 101 will be hereinafter described. Interlayer insulation film 60a (FIG. 10) has a high dielectric constant film 62S (FIG. 10) that does not extend to substrate side surface PS, unlike interlayer insulation film 60 having high dielectric constant film 62 (FIG. 1) that extends to substrate side surface PS. It is preferable that high dielectric constant film 62S is located on upper surface P2 of epitaxial substrate 20 so as to extend over guard ring portion 26 and outer edge portion OE (FIG. 1). In interlayer insulation film 60b (FIG. 11), high dielectric constant film 62 is not located between upper surface P2 of epitaxial substrate 20 and low dielectric constant film 61, but located on upper surface P2 with low dielectric constant film 61 interposed therebetween. Interlayer insulation film 60c (FIG. 12) further has a low dielectric constant film 63 between upper surface P2 of epitaxial substrate 20 and high dielectric constant film 62.

(Second Embodiment)

Figure 13:
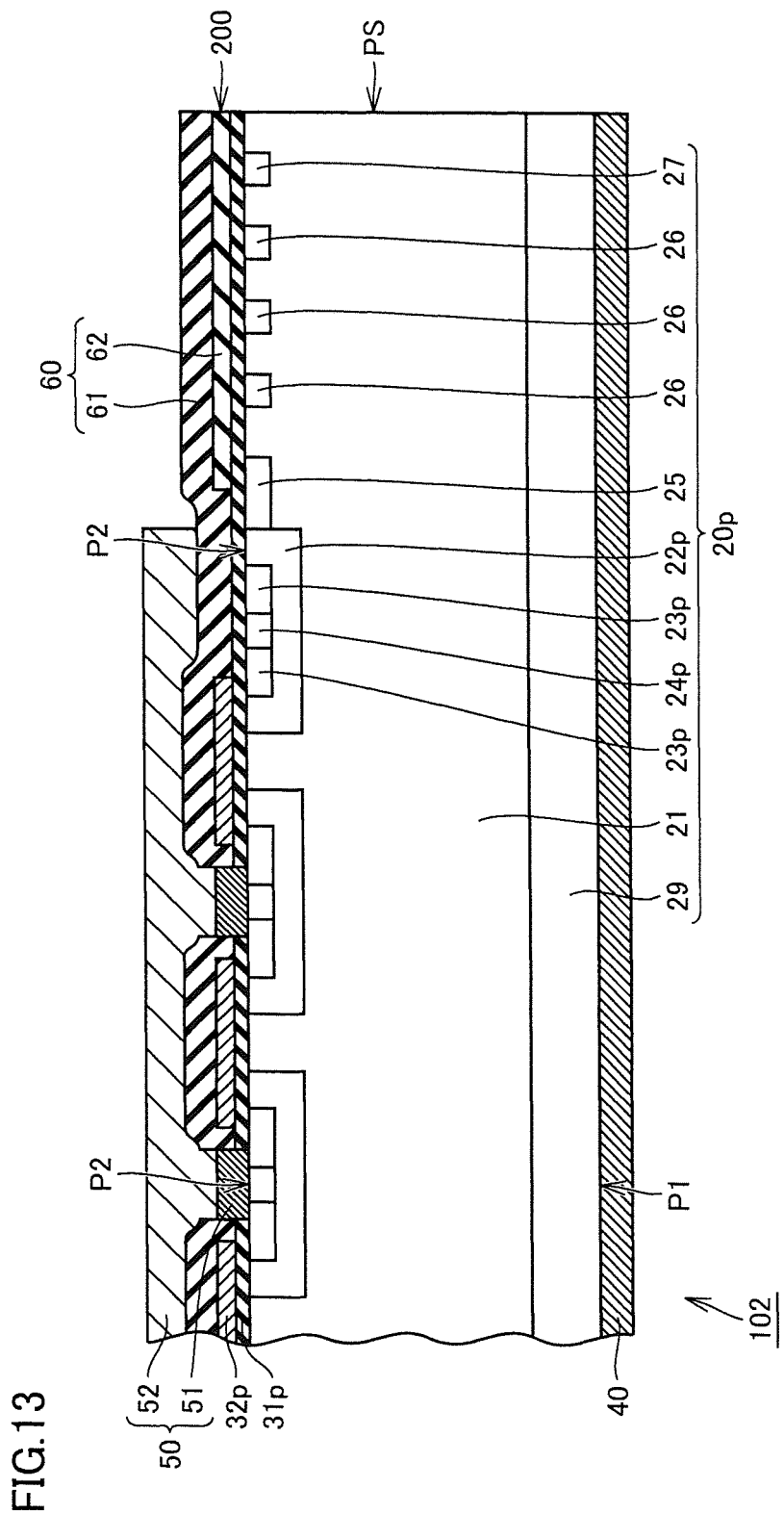
FIG. 13 is a partial cross-sectional view schematically showing the configuration of a semiconductor device in the second embodiment of the present invention.

As shown in FIG. 13, a MOSFET 102 (semiconductor device) is a planar gate type transistor. MOSFET 102 includes an epitaxial substrate 20p (semiconductor substrate), a gate oxide film 31p (gate insulating film), and a gate electrode 32p. Epitaxial substrate 20p includes a body region 22p, a source region 23p, and a contact region 24p.

Since the configuration other than those described above is almost the same as the configuration of the above-described first embodiment, the same or corresponding components are designated by the same reference characters, and description thereof will not be repeated. Almost the same effects as those in the first embodiment can be achieved also by the present embodiment.

(Third Embodiment)

Figure 14:
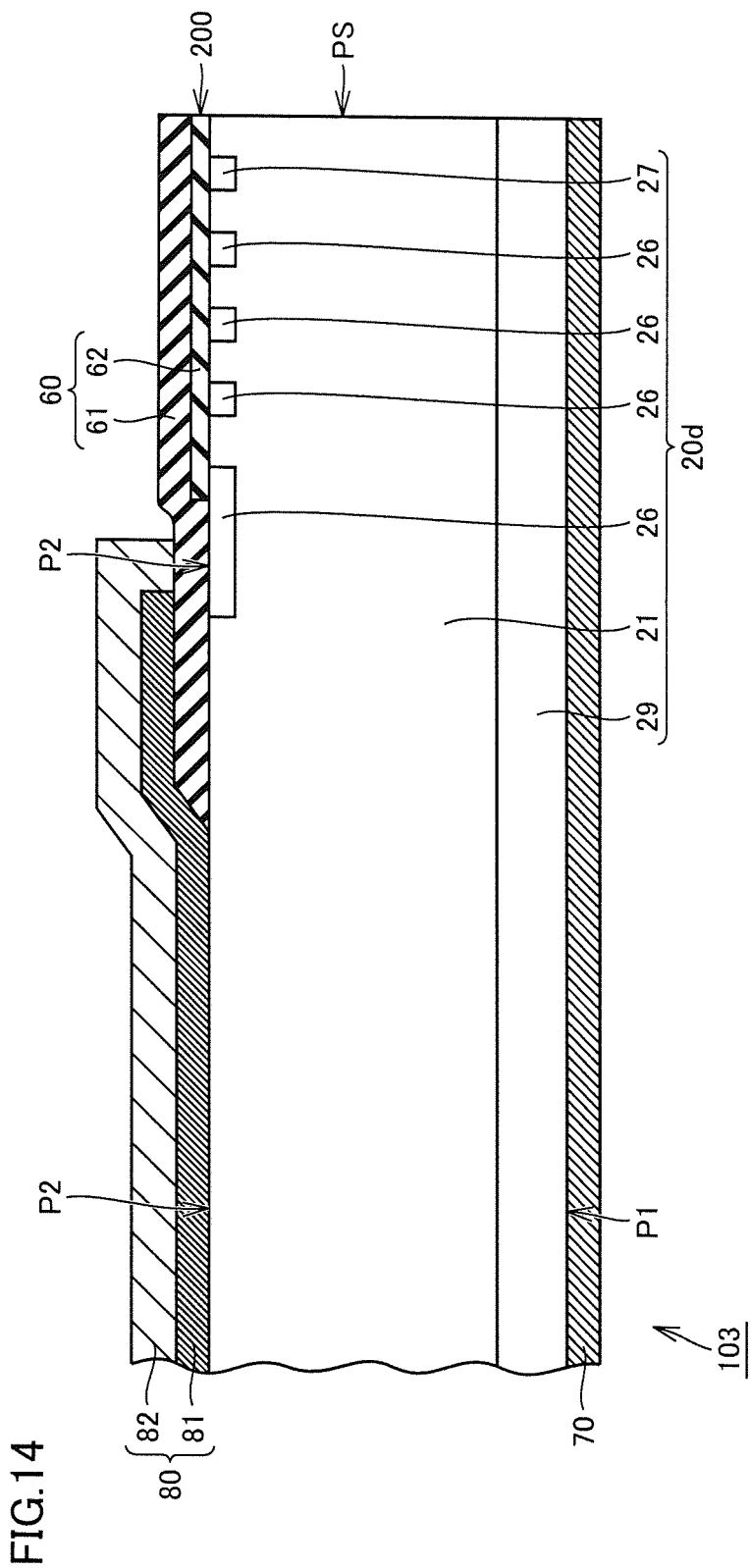
FIG. 14 is a partial cross-sectional view schematically showing the configuration of a semiconductor device in the third embodiment of the present invention.

As shown in FIG. 14, a diode 103 (semiconductor device) includes a Schottky diode that provides rectification between an ohmic electrode layer 70 and a Schottky electrode layer 80. Diode 103 has an epitaxial substrate 20d, an ohmic electrode layer 70 (the first electrode layer), and a Schottky electrode layer 80 (the second electrode layer). Schottky electrode layer 80 has a Schottky portion 81 and a wiring portion 82.

Since the configuration other than those described above is almost the same as the configuration of the above-described first embodiment, the same or corresponding components are designated by the same reference characters, and description thereof will not be repeated.

According to the present embodiment, occurrence of creeping discharge on the termination insulation portion of interlayer insulation film 60 can be prevented while avoiding an increase in volume of the wiring in Schottky electrode layer 80.

It should be understood that the embodiments disclosed herein are illustrative and non-restrictive in every respect. The scope of the present invention is defined by the terms of the claims, rather than the description above, and is intended to include any modifications within the meaning and scope equivalent to the terms of the claims. For example, the semiconductor device may be a MISFET (Metal Insulator Semiconductor Field Effect Transistor) other than a MOSFET. Furthermore, the channel type of the transistor is not limited to an n-channel type, but may be a p-channel type. In this case, the configuration having p type conductivity and n type conductivity replaced in the above-described embodiment can be employed. Furthermore, the transistor is not limited to a unipolar type but may be a bipolar type such as an IGBT (Insulated Gate Bipolar Transistor).

REFERENCE SIGNS LIST 20, 20d, 20p epitaxial substrate (semiconductor substrate), 20E element portion, 20T termination portion, 21 drift layer, 22, 22p body region, 23, 23p source region, 24 contact region, 25 JTE region, 26 guard ring portion, 27 field stop portion, 29 single-crystal substrate, 31, 31p gate oxide film (gate insulating film), 32, 32p gate electrode, 40 drain electrode layer (first electrode layer), 50 source electrode layer (second electrode layer), 51 ohmic portion, 52, 82 wiring portion, 60, 60a to 60c interlayer insulation film, 70 ohmic electrode layer (first electrode layer), 80 Schottky electrode layer (second electrode layer), 61 low dielectric constant film, 62 high dielectric constant film, 81 Schottky portion, 90 mask layer, 101, 102 MOSFET (semiconductor device), 103 diode (semiconductor device), BT bottom surface, OE outer edge portion, P1 lower surface (first surface), P2 upper surface (second surface), PS substrate side surface, SW sidewall surface, TR Trench.

The invention claimed is:

1. A semiconductor device comprising:
   a semiconductor substrate made of a wide band gap semiconductor and having a first surface and a second surface opposite to said first surface, said semiconductor substrate having an element portion and a termination portion located on an outer side of said element portion;
a first electrode layer provided on said first surface of said semiconductor substrate;
a second electrode layer provided on said second surface of said semiconductor substrate in an upper portion of said element portion; and
an interlayer insulation film provided on said second surface of said semiconductor substrate, said interlayer insulation film having an element insulation portion providing insulation between a part of said element portion of said semiconductor substrate and said second electrode layer, and a termination insulation portion covering said termination portion of said semiconductor substrate, said termination insulation portion including a high dielectric constant film that is higher in dielectric constant than said element insulation portion,
wherein said high dielectric constant film is provided only on said termination insulation portion among said element insulation portion and said termination insulation portion.

2. The semiconductor device according to claim 1, wherein said interlayer insulation film includes a low dielectric constant film having the dielectric constant of said element insulation portion and included in each of said element insulation portion and said termination insulation portion.

3. The semiconductor device according to claim 2, wherein said high dielectric constant film is located between said second surface of said semiconductor substrate and said low dielectric constant film.

4. The semiconductor device according to claim 1, wherein said second surface of said semiconductor substrate includes an outer edge portion having a first conductivity type and located at an outer edge of said second surface, and a guard ring portion having a second conductivity type different from said first conductivity type and located on an inner side of said outer edge portion.

5. The semiconductor device according to claim 4, wherein said high dielectric constant film is located on said second surface of said semiconductor substrate so as to extend over said guard ring portion and said outer edge portion.

6. The semiconductor device according to claim 1, wherein said semiconductor substrate has a substrate side surface connecting said first surface and said second surface, and said high dielectric constant film extends to a surface that is located in line with said substrate side surface.

7. The semiconductor device according to claim 1, wherein said wide band gap semiconductor is one of silicon carbide and gallium nitride.

8. The semiconductor device according to claim 1, wherein said semiconductor device is configured such that a voltage of 600V or more can be applied between said first electrode layer and said second electrode layer.

9. The semiconductor device according to claim 1, wherein said semiconductor device includes a transistor that provides switching between said first electrode layer and said second electrode layer.

10. The semiconductor device according to claim 1, wherein said semiconductor device includes a diode that provides rectification between said first electrode layer and said second electrode layer.

* * * * *